United States Patent
Aihara et al.

(10) Patent No.: US 12,051,884 B2
(45) Date of Patent: Jul. 30, 2024

(54) SEMICONDUCTOR OPTICAL ELEMENT

(71) Applicant: Nippon Telegraph and Telephone Corporation, Tokyo (JP)

(72) Inventors: Takuma Aihara, Tokyo (JP); Shinji Matsuo, Tokyo (JP); Tai Tsuchizawa, Tokyo (JP); Takaaki Kakitsuka, Tokyo (JP); Tatsurou Hiraki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 953 days.

(21) Appl. No.: 17/045,003

(22) PCT Filed: Mar. 28, 2019

(86) PCT No.: PCT/JP2019/013591
§ 371 (c)(1),
(2) Date: Oct. 2, 2020

(87) PCT Pub. No.: WO2019/198529
PCT Pub. Date: Oct. 17, 2019

(65) Prior Publication Data
US 2021/0175685 A1    Jun. 10, 2021

(30) Foreign Application Priority Data

Apr. 13, 2018  (JP) .................................. 2018-077341

(51) Int. Cl.
*H01S 5/10* (2021.01)
*H01S 5/02* (2006.01)
(Continued)

(52) U.S. Cl.
CPC ............ *H01S 5/1014* (2013.01); *H01S 5/021* (2013.01); *H01S 5/0261* (2013.01); *H01S 5/142* (2013.01)

(58) Field of Classification Search
CPC ...... H01S 5/1014; H01S 5/021; H01S 5/0261; H01S 5/142
See application file for complete search history.

(56) References Cited

U.S. PATENT DOCUMENTS

2015/0132002 A1* 5/2015 Krishnamurthy ....... H01S 5/142
398/79
2016/0103281 A1* 4/2016 Matsumoto ........ G02B 6/29352
385/11
(Continued)

FOREIGN PATENT DOCUMENTS

JP    2007047326 A    2/2007
JP    4402912 B2    1/2010
(Continued)

OTHER PUBLICATIONS

Hidetaka Nishi et al., "SiOxNy Back-End Integration Technologies forHeterogeneously Integrated Si Platform," ECS Transactions, vol. 75, No. 8, 2016, pp. 211-221.

*Primary Examiner* — Yuanda Zhang
(74) *Attorney, Agent, or Firm* — Slater Matsil, LLP

(57) ABSTRACT

A wavelength tunable laser formed on a substrate made of single-crystal silicon is provided. The wavelength tunable laser includes a light emitting portion made of a III-V compound semiconductor, and external resonators provided with an optical filter. Cores included in the external resonators are made of one of SiN, SiON, and $SiO_n$ (n is smaller than 2).

14 Claims, 10 Drawing Sheets

(51) Int. Cl.
*H01S 5/026* (2006.01)
*H01S 5/14* (2006.01)

(56) References Cited

U.S. PATENT DOCUMENTS

| | | |
|---|---|---|
| 2016/0336718 A1 | 11/2016 | Takabayashi et al. |
| 2017/0098922 A1* | 4/2017 | Hatori .................. H04B 10/501 |
| 2019/0058306 A1* | 2/2019 | Wen ........................ H01S 5/142 |
| 2019/0250328 A1* | 8/2019 | Yagi ....................... G02B 6/132 |

FOREIGN PATENT DOCUMENTS

| | | |
|---|---|---|
| JP | 2010186132 A | 8/2010 |
| JP | 2016213379 A | 12/2016 |

* cited by examiner (a)                  (b)

SEMICONDUCTOR OPTICAL ELEMENT

CROSS-REFERENCE TO RELATED APPLICATIONS

This application is a national phase entry of PCT Application No. PCT/JP2019/013591, filed on Mar. 28, 2019, which claims priority to Japanese Application No. 2018-077341, filed on Apr. 13, 2018, which applications are hereby incorporated herein by reference.

TECHNICAL FIELD

The present invention relates to a semiconductor optical element provided with a wavelength tunable laser with an external resonator.

BACKGROUND

An increase in communication traffic volume on the Internet and the like has resulted in demand for an increase in speed and an increase in capacity of optical fiber transmission. To meet these demands, development of digital coherent communication technology in which coherent optical communication technology and digital signal processing technology are utilized has advanced, and a 100G system has come into practical use. Such a communication system requires a high-power narrow-linewidth wavelength tunable laser as a local light source for transmission and reception. Also, there is demand for a reduction in size and cost of a device.

A wavelength tunable laser mainly includes a light emitting portion made of a semiconductor, and an external resonator provided with an external optical filter, and the oscillation wavelength of the laser is controlled by controlling the optical wavelength characteristics of this optical filter using heat, a carrier plasma effect, or the like. Wavelength tunable lasers in which a super-structure grating, a multi-ring filter, and a ladder filter are used have been reported (see Patent Literature 1). The main material of these wavelength tunable lasers is a direct-band-gap III-V compound semiconductor. Optical confinement is realized by adjusting the composition of the III-V compound semiconductor and imparting a difference in a refractive index between a core and a cladding.

In recent years, with demand for a reduction in the cost of optical transmitting-receiving devices in mind, silicon photonics technology has gained attention. With this technology, mature silicon processing technology is utilized to form an optical device with a high density in a large area on a circular silicon substrate (wafer) with a large diameter, thus making it possible to reduce the cost of the optical device and an optical integrated circuit. However, since silicon is an indirect-band-gap semiconductor, a highly efficient silicon laser has not been realized, and integration of a silicon laser and other optical devices on one silicon substrate has not been realized. Although a flip chip bonding method can be used to connect a semiconductor laser made of a III-V compound semiconductor to a silicon photonics circuit, the assembly cost increases, and thus a reduction in the cost of optical transmitting-receiving devices remains limited.

On the other hand, using wafer bonding technology that is currently under research and development enables hetero-integration of a silicon photonics circuit and a semiconductor laser on one silicon substrate. Accordingly, if a wavelength tunable laser can be provided on a silicon substrate using the wafer bonding technology, it is more likely that the potential for reducing the cost of an optical transmitting-receiving device can be increased.

CITATION LIST

Patent Literature

PTL 1—Japanese Patent No. 4402912

SUMMARY

A wavelength tunable laser mainly includes a light emitting portion (optical amplifier), an optical resonator, and a mechanism (e.g., heater) for adjusting a resonance spectrum of the optical resonator. In the case of forming a wavelength tunable laser on a silicon substrate, a III-V compound semiconductor formed through direct bonding has been used as the material for forming a light emitting portion, and a III-V compound semiconductor (e.g., InP) or silicon (Si) has been used as the material of an optical waveguide core included in an optical resonator.

However, InP and Si are materials with a high non-linear optical constant, and thus a non-linear effect cannot be ignored. For example, two-photon absorption loss is increased due to high power density inside the optical waveguide. This is a practical problem in a laser that requires high power. In addition, since a relative refractive index difference between InP or Si and a material of a cladding such as $SiO_2$ is large, the properties of the optical resonator are remarkably impaired due to a dimensional error or variation in the width, thickness, and the like of the optical waveguide core. This impairs the properties and yield of a laser.

The present invention was achieved to solve the foregoing problems, and an object thereof is to make it possible to form a smaller wavelength tunable laser on a substrate made of silicon without impairing the properties and yield of the laser.

Means for Solving the Problem

A semiconductor optical element according to embodiments of the present invention includes a wavelength tunable laser formed on a substrate made of silicon, wherein the wavelength tunable laser includes a light emitting portion made of a III-V compound semiconductor, and an external resonator provided with an optical filter, the external resonator includes an optical waveguide including: a lower cladding layer that is made of an oxide and is formed on the substrate; a core that is made of SiN, SiON, or SiOn (n is smaller than 2) and is formed on the lower cladding layer; and an upper cladding layer that is made of an oxide and covers the core, and the light emitting portion and the external resonator are optically connected via a spot-size converting portion.

The above-mentioned semiconductor optical element includes a semiconductor core that is made of a III-V compound semiconductor, is optically connected to the light emitting portion through butt coupling, and is tapered away from the light emitting portion, wherein a tapered region of the semiconductor core is covered by the core, and the spot-size converting portion is constituted by the tapered region of the semiconductor core covered by the core.

In the above-mentioned semiconductor optical elements, the light emitting portion includes an active layer and current injection portions that are arranged sandwiching the active layer, and the light emitting portion is formed on the lower cladding layer.

In the above-mentioned semiconductor optical elements, a heater for controlling wavelength characteristics of guided light is provided on a portion of the optical waveguide included in the optical filter.

In the above-mentioned semiconductor optical elements, the optical filter includes a lattice filter, a ring filter, an another-mode interferometer, and a loop mirror.

In the above-mentioned semiconductor optical element, the lattice filter includes a plurality of delay interference filters that are optically connected in a multi-stage manner, and delay lengths of the stages formed of the plurality of delay interference filters are different from each other.

The above-mentioned semiconductor optical elements include a core portion made of a semiconductor that is provided on a port of any of the lattice filter, the ring filter, and the another-mode interferometer, or an anti-reflection structure formed of a metal layer.

The above-mentioned semiconductor optical elements include a structure for a power consumption reduction including a core portion that is made of a semiconductor and is provided in a region of the optical filter.

Effects of Embodiments of the Invention

As described above, with embodiments of the present invention, the core included in the external resonator is made of one of SiN, SiON, and SiOn (n is smaller than 2), and thus an excellent effect that a smaller wavelength tunable laser can be formed on a substrate made of silicon without impairing the properties and yield of the laser is obtained.

DETAILED DESCRIPTION OF ILLUSTRATIVE EMBODIMENTS

Figure 1A:
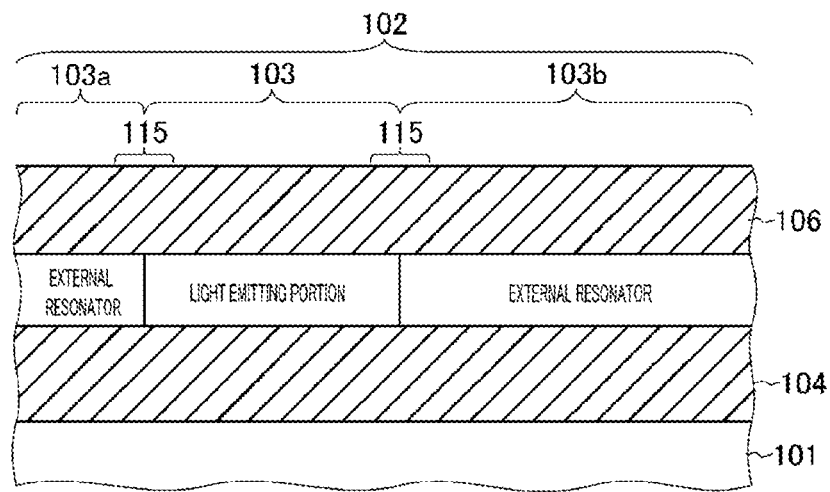
FIG. 1A is a cross-sectional view showing a configuration of a semiconductor optical element according to an embodiment of the present invention.
Figure 1B:
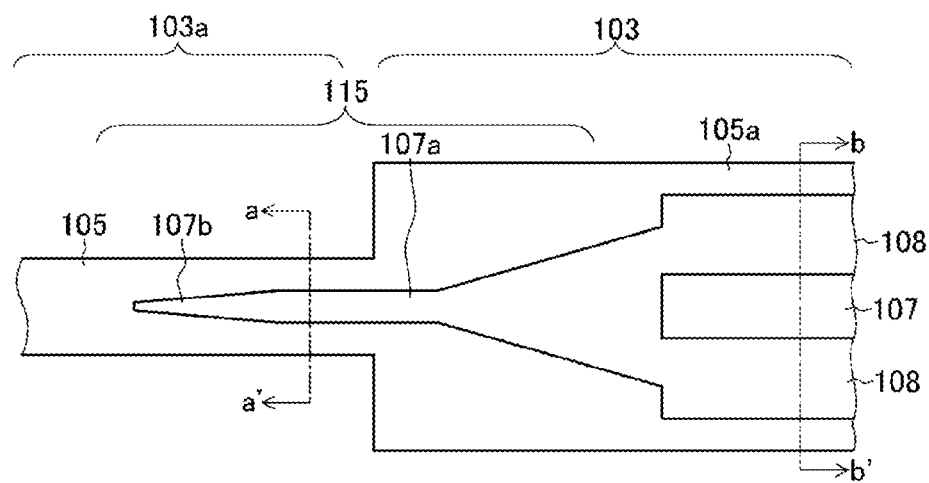
FIG. 1B is a plan view showing a portion of the configuration of the semiconductor optical element according to the embodiment of the present invention.
Figure 1C:
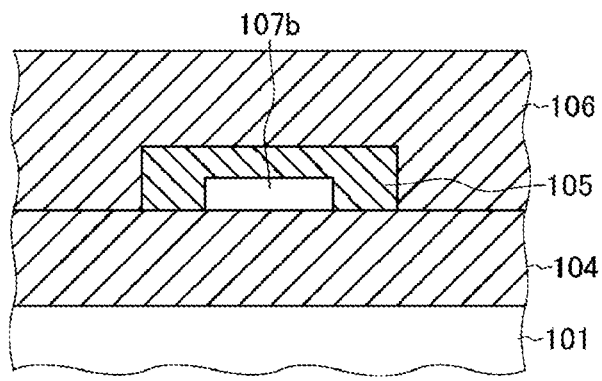
FIG. 1C is a cross-sectional view showing a portion of the configuration of the semiconductor optical element according to the embodiment of the present invention.
Figure 1D:
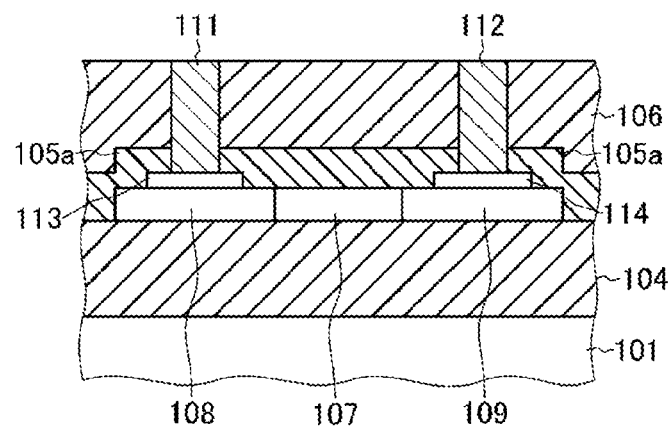
FIG. 1D is a cross-sectional view showing a portion of the configuration of the semiconductor optical element according to the embodiment of the present invention.
Figure 1E:
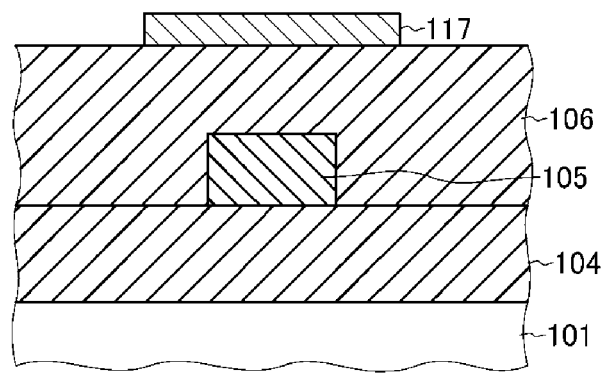
FIG. 1E is a cross-sectional view showing a portion of the configuration of the semiconductor optical element according to the embodiment of the present invention.

Hereinafter, a semiconductor optical element according to an embodiment of the present invention will be described with reference to FIGS. 1A to 1E. It should be noted that FIG. 1A shows a cross section that is parallel to a direction in which light is guided. FIG. 1B is a plan view. FIGS. 1C to 1E show cross sections that are orthogonal to the direction in which light is guided. This semiconductor optical element includes a wavelength tunable laser 102 formed on a substrate 101 made of single-crystal silicon. The wavelength tunable laser 102 includes a light emitting portion 103 made of a III-V compound semiconductor, and external resonators 103a and 103b, provided with an optical filter.

Each of the external resonators 103a and 103b includes an optical waveguide including a lower cladding layer 104 that is made of an oxide and is formed on the substrate 101, a core 105 that is formed on the lower cladding layer 104, and an upper cladding layer 106 that is made of an oxide and covers the core 105. In the embodiment, the core 105 is made of one of SiN, SiON, and $SiO_n$ (n is smaller than 2). For example, the core 105 is made of SiN.

The lower cladding layer 104 is made of silicon oxide ($SiO_2$) and has a thickness of about 3 µm, for example. It is sufficient that the lower cladding layer 104 is formed by performing thermal oxidation on the surface of the substrate 101 made of silicon, for example. The upper cladding layer 106 is made of silicon oxide and has a thickness of about 3 µm, for example.

The light emitting portion 103 is optically connected to the external resonators 103a and 103b via spot-size converting portions 115. As shown in FIGS. 1B and 1C, a semiconductor core 107a including a tapered portion 107b that is tapered away from the light emitting portion 103 is optically connected to the light emitting portion 103 through butt coupling. The semiconductor core 107a is made of InP, for example. The semiconductor core 107a and the tapered portion 107b are covered by the core 105 (FIG. 1C). The spot-size converting portion 115 is constituted by a region including the tapered portion 107b covered by the core 105. FIG. 1C shows a cross section taken along line aa' in FIG. 1B.

It is preferable that the width of the leading end of the tapered portion 107b is small because the smaller the width of the leading end is, the more optical coupling loss is reduced, however the aspect ratio between the width and thickness of the leading end is increased, thus making it difficult to process this portion. Accordingly, in order to reduce the aspect ratio, it is preferable that the semiconductor core 107a and the tapered portion 107b are thin. For example, it is sufficient that the thicknesses of the semiconductor core 107a and the tapered portion 107b are 200 to 300 nm. A lateral-current-injection-type embedded active layer thin film structure of the light emitting portion 103, which will be described later, can be joined to the semiconductor core 107a via a butt joint, and is thus excellent from the viewpoint of optical connection to the optical waveguide including the core 105 made of SiN, which is a different material.

The light emitting portion 103 is formed on the lower cladding layer 104 and includes an active layer 107, and current injection portions 108 and 109 that are arranged to sandwich the active layer 107, as shown in FIG. 1D. In the embodiment, the active layer 107 and the current injection portions 108 and 109 are covered by a core extension portion 105a that is made of SiN and is formed to be continuous with the core 105, and the upper cladding layer 106 is formed on the core extension portion 105a. The core extension portion 105a serves as a passivation layer in the light emitting portion 103. The active layer 107 and the current injection portions 108 and 109 are made of InP, for example. The active layer 107 is made of bulk InP, for example. The active layer 107 may also have a multiple quantum-well structure that is made of InGaAsP or InGaAlAs and has a thickness of about 100 nm. FIG. 1D shows a cross section taken along line bb' in FIG. 1B.

The current injection portion 108 is doped with a p-type dopant and is thus of a p-type, for example, and the current injection portion 109 is doped with an n-type dopant and is thus of an n-type, for example. The current injection portions 108 and 109 are, for example, respectively connected to electrodes in and 112 via contact layers 113 and 114 made of a compound semiconductor that is doped with a dopant at a higher concentration. The electrodes in and 112 are formed passing through the core extension portion 105a and the upper cladding layer 106. It should be noted that, in the example shown in FIG. 1D, a so-called lateral-current-injection-type embedded active layer structure is employed, but there is no limitation thereto. A configuration may also be employed in which the active layer is sandwiched between two current injection portions in the normal direction of the surface of the substrate 101.

As shown in FIG. 1E, a heater 117 formed of a metal layer is formed on a portion of the upper cladding layer 106 of the external resonator 103b, and thus an optical filter for controlling the wavelength characteristics of guided (transmitted) light is formed.

With the embodiment, in the external resonators 103a and 103b provided with an optical filter, the lower cladding layer 104 and the upper cladding layer 106 are made of an oxide such as silicon oxide, and are thus have a very different refractive index from the core 105 and active layer 107 made of a compound semiconductor such as InP. Accordingly, high optical confinement can be achieved in the core 105 and the active layer 107. In the external resonators 103a and 103b, abrupt bending of the optical waveguide and high integration can be achieved, and thus a reduction in the size of the optical filter can also be achieved. In addition, the gain per unit length is increased, thus making it possible to reduce the length of the light emitting portion 103 in the guiding direction.

As described above, the feature of the embodiment is that the cores 105 included in the external resonators 103a and 103b are made of one of SiN, SiON, and $SiO_n$ (n is smaller than 2). This feature will be described below.

First, Si and InP, which have been conventionally used as materials of the core, are materials having a high non-linear optical constant, and two-photon absorption loss is caused due to high power density inside the optical waveguide. Thus, a non-linear effect cannot be ignored. The value of the effective non-linear parameter γ determined in consideration of the non-linear constant of a material and the mode field diameter of an optical waveguide is about 300 ($W^{-1}m^{-1}$) in the case of an optical waveguide in which the core is made of Si (Si optical waveguide). In the case where the core is made of InP, γ is substantially the same. A problem that a non-linear optical effect is exhibited inside the Si optical waveguide becomes evident particularly when light with several tens dBm of power is incident thereon.

This is a practical problem in a laser that requires high power. On the other hand, in the case of an optical waveguide in which the core is made of SiN (SiN optical waveguide), γ is about 1.4 ($W^{-1}m^{-1}$), and the non-linear optical effect can be sufficiently suppressed compared with the Si optical waveguide, thus making it possible to increase power resistance compared with the case where Si is used. In other words, the non-linear optical effect is less likely to be exhibited in the SiN optical waveguide compared with the Si optical waveguide, and thus the SiN optical waveguide is suitable as a material of an external resonator for a high-power narrow-linewidth wavelength tunable laser.

A relative refractive index difference (Δ) between the Si core and the $SiO_2$ cladding is about 41% (substantially the same value is obtained in the case of the InP optical waveguide), high optical confinement is achieved, and the minimum bending radius is about 3 μm, which is very small. Therefore, a high degree of integration can be expected. However, in the case of the Si optical waveguide, a large phase error is caused by a processing error due to high optical confinement, resulting in the impairment of the external resonator properties. It is difficult to realize uniform in-plane distribution due to an increase in the area of a substrate, resulting in a large processing error. Therefore, in order to ensure a sufficient processing tolerance, a material of an optical waveguide needs to be selected such that a relative refractive index difference is smaller compared with the Si optical waveguide, and SiN whose refractive index is between those of $SiO_x$ and Si is suitable as a material of the core from the viewpoint of the integration degree and the processing tolerance. For these reasons, a material such as SiN, SiON, or $SiO_n$ (n is smaller than 2) is used as the material of the cores 105 included in the external resonators 103a and 103b.

When the core 105 is formed of SiN, it is sufficient that an SiN film is formed using a known ECR plasma CVD method, for example. In the ECR plasma CVD method, ions with high electron energy are used to advance a film forming reaction, and therefore, there is no need to heat the substrate, thus making it possible to form the film at a low temperature. With this film formation method, the cores 105 included in the external resonators 103a and 103b, the core extension portion 105a, and the like can be formed without breaking active optical devices formed on the Si substrate, such as the light emitting portion.

Incidentally, when a material gas such as $SiH_4$ or $Si_2H_6$ is used to form a film made of SiN, SiON, or $SiO_n$ (n is smaller than 2), an N—H group is formed in the deposited film. Light at a wavelength of about 1.510 nm is absorbed due to the stretching vibration of the N—H group. This wavelength is used in optical communication, and therefore, if an optical waveguide is formed using a film containing an N—H group therein, the absorption of light becomes problematic. To address this, the formation of an N—H group is suppressed by using a material gas such as deuterium silane gas in which deuterium is used instead of hydrogen, thus making it possible to solve the foregoing problems.

Figure 2:
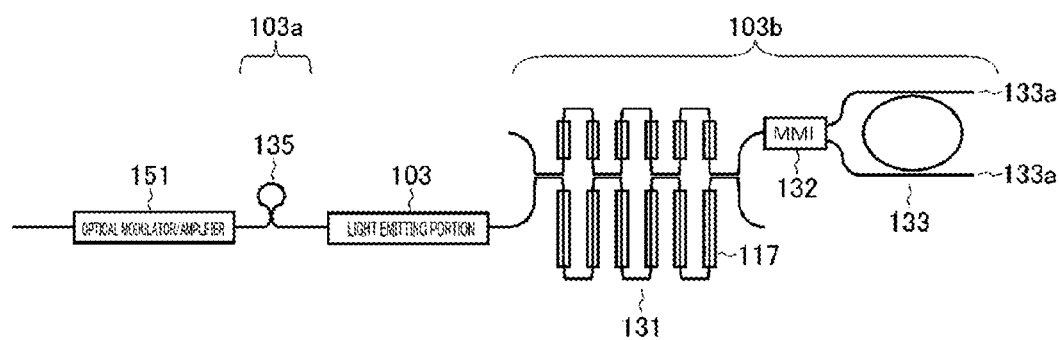
FIG. 2 is a plan view showing the configuration of the semiconductor optical element according to the embodiment of the present invention.

Here, as shown in FIG. 2, a configuration can be applied in which the external resonator 103b includes a lattice filter 131, a multimode interferometer (MMI) 132, a ring filter 133, a loop mirror 135, and the like. It should be noted that FIG. 2 shows an example in which an optical modulator/amplifier 151 is connected to the leading end side of the loop mirror 135. These members are optically connected. The lattice filter 131 has a configuration in which delay interference filters are connected in a multi-stage manner, and the free spectral range (FSR) can be determined based on the delay lengths thereof. It should be noted that, normally, a resonator has a plurality of resonance frequencies, and an interval between these resonance frequencies is called an FSR.

The transmission peak wavelength can be changed by heating the arms of the lattice filter 131 using a heater 117, and thus the lattice filter 131 can be used as an optical filter with a wide variable wavelength range. The transmissivity of the ring filter 133 varies at a constant frequency interval, and thus the ring filter 133 is used as an optical filter for wavelength locking. The loop mirror 135 is constituted by a directional coupler and a loop-type optical waveguide, and the transmissivity and the reflectivity can be adjusted as desired depending on the coupling coefficient of the directional coupler. The optical filter of the wavelength tunable laser configured as described above has a configuration in which a ring filter 133 for wavelength locking that has an FSR corresponding to the interval of an oscillating frequency to be output, and a lattice filter 131 having a large variable wavelength range are combined.

Figure 3:
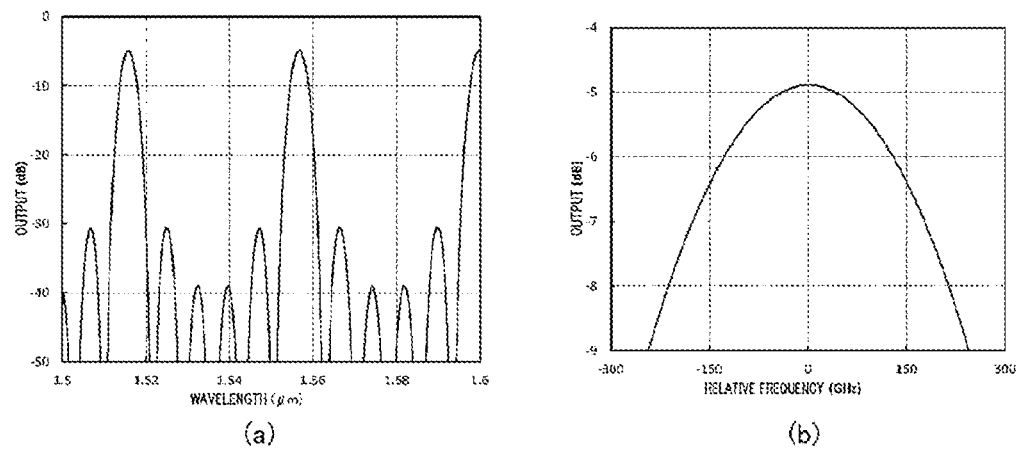
FIG. 3 shows characteristic diagrams showing calculation results of a transmission spectrum of a lattice filter 131.
Figure 4:
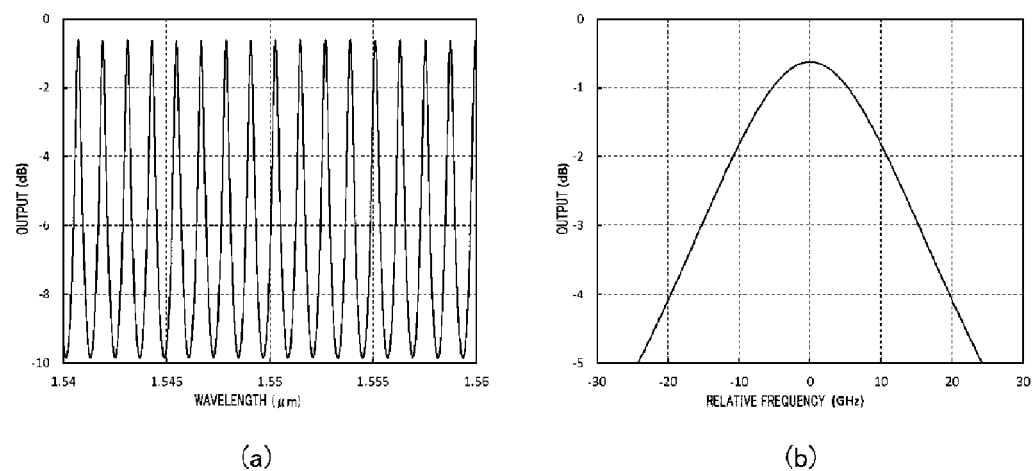
FIG. 4 shows characteristic diagrams showing calculation results of a transmission spectrum of a ring filter 133.

FIG. 3 shows calculation results of a transmission spectrum of the lattice filter 131, and FIG. 4 shows calculation results of a transmission spectrum of a ring filter 133. In the ring filter 133, light at a non-resonance wavelength is output to a port 133a. If the core end face of the optical waveguide that forms such a port 133a located at the terminus is cut at a right angle, for example, light is reflected off this end face and becomes stray light, and thus the wavelength characteristics of the optical filter are impaired. This causes instability in the oscillation mode of the laser. Even if the poll 133a is tapered and light is emitted thereto from the optical waveguide, the characteristics of the laser may be unexpectedly impaired due to cross talk caused by the emitted light being incident on the external resonator 103b included in the optical filter or the light emitting portion 103.

Here, when Si or InP is used as the material of the optical filter, reflection on the port end face is suppressed by doping Si or InP for forming the port with a dopant when active optical devices such as an optical modulator are formed and thus allowing the port to absorb light. However, in the embodiment, the core 105 is made of SiN, and therefore, it is difficult to suppress reflection on the end face by doping the core 105 with a dopant in a subsequent step because the core 105 has been already formed.

Accordingly, the following configuration (anti-reflection measure) is applied to the embodiment.

Figure 5A:
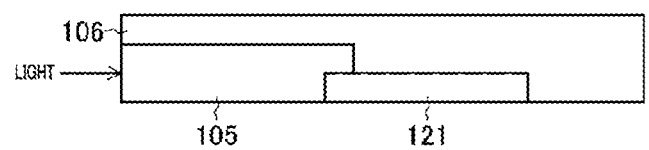
FIG. 5A is a plan view showing a portion of a configuration of a terminal portion.

As shown in FIG. 5A, as an anti-reflection structure, a semiconductor core portion 121 made of InP is provided at the leading end of the core 105 made of SiN and is optically connected thereto. The semiconductor core portion 121 is doped with the p-type dopant that was used to form the light emitting portion 103. A p-type InP has a high optical absorption coefficient, thus making it possible to allow quenching in the semiconductor core portion 121. Since the dopant concentration of $1\times10^{18}$ cm$^{-3}$ corresponds to 20 cm$^{-1}$, the doping concentration is set to about $5\times10^{18}$ cm$^{-3}$, and the length of the core of the semiconductor core portion 121 is set to about 500 μm. This enables quenching of about 20 dB. It is preferable that the semiconductor core portion 121 is formed in a meandering or spiral folded shape instead of a linear shape in order to reduce the area thereof. The same measure is also applied to the lattice filter 131 and an unnecessary port of the MMI 132.

Anti-Reflection Measure 2

Figure 5B:
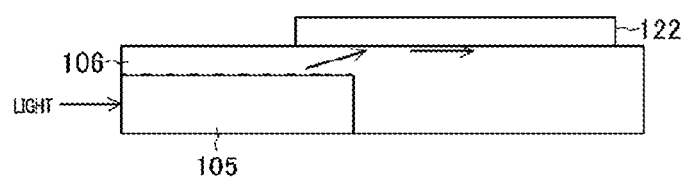
FIG. 5B is a plan view showing a portion of the configuration of the terminal portion.

As shown in FIG. 5B, as an anti-reflection structure, a surface plasmon optical waveguide made of a metal layer 122 is provided on the leading end side of the core 105 made of SiN and is optically connected thereto. With a surface plasmon mode in the surface plasmon optical waveguide, light can be attenuated over a short distance due to the electron scattering mechanism in the metal layer 122. In order to excite the surface plasmon mode from the mode of the optical waveguide including the core 105, the leading end of the core 105 is formed in an asymmetrical shape, and thus a polarized wave is rotated to a polarized wave for exciting the surface plasmon. In addition, the leading end of the core 105 is formed in a tapered shape to extend the optical mode. The same measure is also applied to the lattice filter 131 and an unnecessary port of the MMI 132.

Next, the optical filters in the external resonators 103a and 103b will be described. Since SiN exhibits a thermooptic effect, the wavelength characteristics of the optical filter can be controlled using heat. Accordingly, as described with reference to FIG. 1E, the heater 117 for heating is arranged above the core 105 with the upper cladding layer 106 made of SiO$_2$ being located therebetween, and the refractive index of the core 105 is changed by heat to perform wavelength control of the optical filter. It is necessary to apply electric power to the heater 117 from the outside to heat the heater 117 in order to cause a desired wavelength change. Needless to say, it is desirable that the amount of electric power is small. Here, a structure for causing a wavelength change with a smaller amount of electric power will be described. Since Si and InP have a higher thermooptic coefficient than that of SiN, a wavelength change can be caused with a smaller amount of electric power by using semiconductor materials such as Si and InP together.

A power consumption reduction measure will be described below.

Power Consumption Reduction Measure 1

Figure 6A:
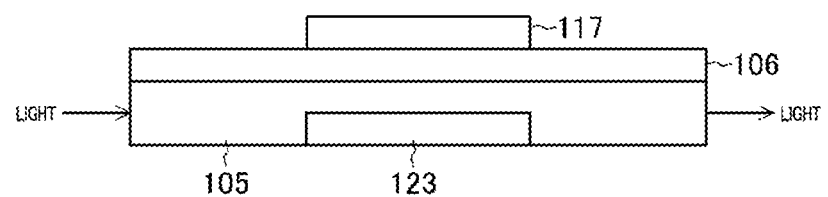
FIG. 6A is a cross-sectional view showing a portion of a configuration of an optical filter provided in an external resonator.

As shown in FIG. 6A, in the optical filter region, a semiconductor core portion 123 made of InP, which has a high thermooptic coefficient, is embedded in the core 105 as a structure for a power consumption reduction. The semiconductor core portion 123 is arranged at a position overlapping the optical mode of the optical waveguide including the core 105. The semiconductor core portion 123 is tapered in order to suppress light reflection at the end portion of the semiconductor core portion 123. Since InP has a higher thermooptic coefficient than that of SiN, a change in an effective refractive index caused by heat is greater in the optical waveguide structure including the core 105 in which the semiconductor core portion 123 is embedded. As a result, the amount of electric power required to cause a desired wavelength change can be reduced.

Power Consumption Reduction Measure 2

Figure 6B:
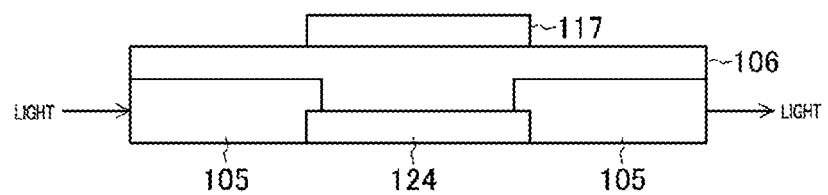
FIG. 6B is a cross-sectional view showing a portion of a configuration of the optical filter provided in the external resonator.

As shown in FIG. 6B, in the optical filter region, the core portion is replaced with a semiconductor core portion 124 made of InP. In this example, the semiconductor core portion 124 serves as a structure for a power consumption reduction.

At a portion where the optical waveguide including the core 105 and the optical waveguide including the semiconductor core portion 124 are optically connected to each other, a spot-size converting structure such as a tapered leading end of the semiconductor core portion 124 is employed. The amount of electric power to be applied thereto can be reduced for the same reason as described in the power consumption reduction measure 1.

It should be noted that the above-described optical filter region (in which a wavelength change is to be caused) is a region located directly under the heater 117 in the lattice filter 131, which was described with reference to FIG. 2, for example. However, semiconductor cores as described above are not used in the directional coupler, which is likely to be affected by a processing error, and the ring filter 133, which is likely to be affected by a non-linear optical effect.

Examples of a light reflection mechanism include a mechanism in which a difference in a refractive index between an optical waveguide and a gap provided in a portion of the optical waveguide is utilized, and a mechanism in which a difference in a refractive index between air and an end face of an optical waveguide routed to the end face of a chip is utilized. In the former case, an external quantum efficiency is reduced due to scattering of light at the gap of the optical waveguide. In the latter case, there is a problem that an optical modulator or a booster optical amplifier cannot be integrated in the chip.

Figure 7:
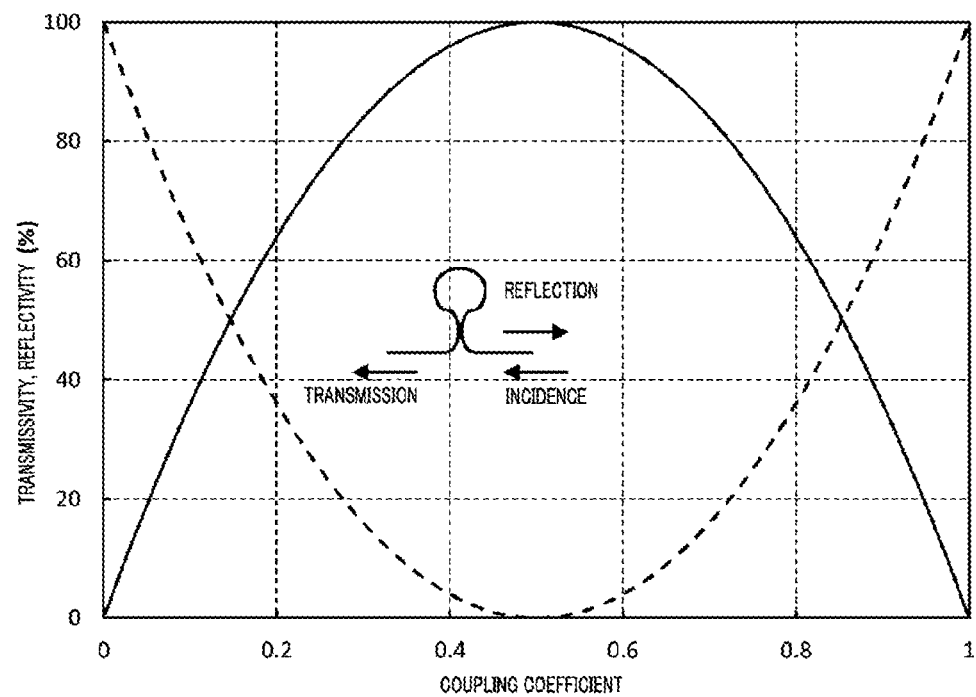
FIG. 7 is a characteristic diagram showing a relationship between the coupling coefficient of a directional coupler included in a loop mirror 135 with the reflectivity (solid line) and the transmissivity (broken line) of the loop mirror 135.

On the other hand, with the above-described loop mirror 135, the transmissivity and the reflectivity can be adjusted as desired depending on the coupling coefficient of the directional coupler theoretically without loss. The reflectivity and the transmissivity are less dependent on a wavelength compared with a diffract grating and the like. FIG. 7 is a graph in which the horizontal axis indicates the coupling coefficient of the directional coupler included in the loop mirror 135, and the vertical axis indicates the reflectivity (solid line) and the transmissivity (broken line) of the loop mirror 135. The reflectivity and the transmissivity can be controlled theoretically without loss (the sum of the reflectivity and the transmissivity is 100%). As described above, with the reflection mechanism in which the loop mirror 135 is used, the wavelength dependency is smaller compared with a diffract grating, and the reflectivity and the transmissivity can be determined as desired. For example, integration of a wavelength tunable light source and an optical modulator or a booster optical amplifier in a chip can be realized by connecting the wavelength tunable light source to a port on a reflection side and the optical modulator or booster optical amplifier to a port on a transmission side.

The lattice filter 131 narrows the bandwidth of this transmission spectrum and thus enables the wavelength tunable laser 102 of the embodiment to stably vary a wavelength. It is sufficient that the delay length is increased (the diffraction order is increased) in order to narrow the bandwidth of the transmission spectrum, but the FSR is reduced at the same time, and thus a problem arises in that oscillations occur at two or more wavelengths. Accordingly, in order to realize a stable oscillation in a single mode, transmissivities need to be reduced at diffraction orders other than a desired diffraction order without increasing the transmission bandwidth. This can be realized by setting the delay lengths of the stages of a delay interferometer, namely the diffraction orders of the stages thereof, to different values instead of the same value.

It should be noted that, in the description above, an example was described in which the materials of both the lattice filter 131 included in the external resonators 103a and 103b and the optical waveguide core of the ring filter 133 are made of SiN, but there is no limitation to this example. For example, a hybrid-type configuration may also be employed in which the optical waveguide core of the ring filter 133, which is likely to be affected by a non-linear effect, is made of SiN, whereas the optical waveguide core of the lattice filter 131 is made of InP, which has a high thermooptic coefficient.

Figure 8A:
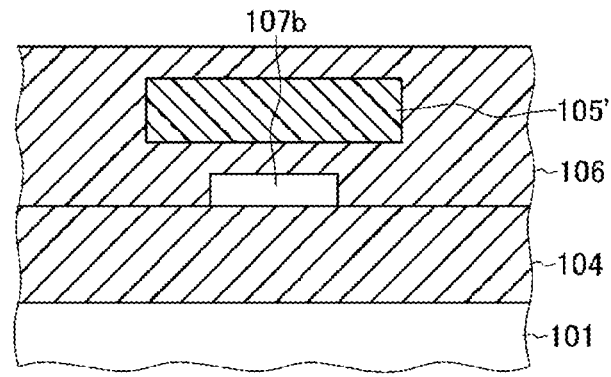
FIG. 8A is a cross-sectional view showing a portion of a configuration of another semiconductor optical element according to the embodiment of the present invention.
Figure 8B:
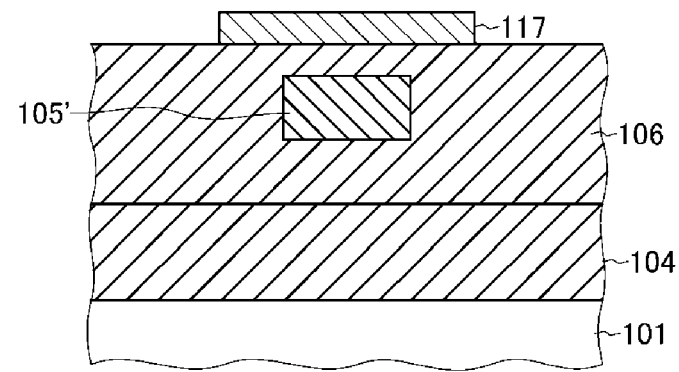
FIG. 8B is a cross-sectional view showing a portion of the configuration of the other semiconductor optical element according to the embodiment of the present invention.

In the above-described embodiment, the structure of the spot-size converting portion 115 in which the optical waveguide including the semiconductor core 107a is optically connected to the optical waveguide including the core 105 has a configuration in which the semiconductor core 107a is covered by the core extension portion 105a, but there is no limitation to this configuration. For example, as shown in FIGS. 8A and 8B, a configuration may also be employed in which a core extension portion 105' made of SiN that is formed to be continuous with the core 105 (not shown) is arranged above the semiconductor core 107a.

In the embodiment, the case where a core made of p-type InP is inserted or a surface plasmon optical waveguide formed of a metal layer is used was described as an example of the termination process for the port of the filter, but there is no limitation to this example. For example, a core made of a semiconductor such as n-type InP or Ge may also be used.

In the embodiment, the structure in which the semiconductor core portion 123 made of InP is embedded in the core 105 in the region (optical filter) in which a wavelength change is to be caused was described as an example, but there is no limitation to this example. For example, the semiconductor core portion 123 may also be made of amorphous silicon.

In the description above, the case where the core included in the external resonator is made of SiN was described, but there is no limitation to this case. For example, the core included in the external resonator may also be made of SiON. In this case, in consideration of the integration degree and the processing tolerance, the refractive index can be changed as desired by changing the ratio of N in SiON. Similarly, the core included in the external resonator may also be made of $SiO_n$ (n is smaller than 2).

Figure 9:
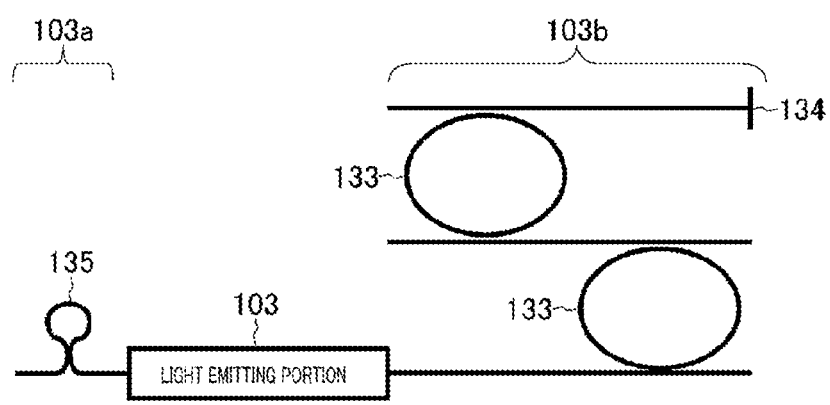
FIG. 9 is a plan view showing the configuration of the other semiconductor optical element according to the embodiment of the present invention.

An example was described in which a lattice filter and a ring filter are used as the optical filter of the external resonator, but there is no limitation to this example. For example, as shown in FIG. 9, a configuration may also be employed in which ring filters 133 are connected to one end of the light emitting portion 103 in series, an end face mirror 134 is provided at an optical output end, and a loop mirror 135 is connected to the other end of the light emitting portion 103. In this case, it is sufficient that heaters are provided on the ring filters 133.

In the description above, the structure in which a wavelength change is caused by heat generated by the heater was described, but there is no limitation to this structure, and a mechanism in which a carrier plasma effect of a semiconductor such as InP is utilized may also be employed.

As described above, with embodiments of the present invention, the core included in the external resonator is made of one of SiN, SiON, and $SiO_n$ (n is smaller than 2), and thus a smaller wavelength tunable laser can be formed on a substrate made of silicon without impairing the properties and yield of the laser.

It should be noted that the present invention is not limited to the embodiment described above, and it is obvious that many modifications and combinations can be made by those ordinarily skilled in the art within the scope of the technical idea of the present invention.

REFERENCE SIGNS LIST

101 Substrate
102 Wavelength tunable laser
103 Light emitting portion
103a External resonator
103b External resonator
104 Lower cladding layer
105 Core
105a Core extension portion
106 Upper cladding layer
107 Active layer
107a Semiconductor core
107b Tapered portion
108 Current injection portion
109 Current injection portion
111 Electrode
112 Electrode
113 Contact layer
114 Contact layer
115 Spot-size converting portion
117 Heater.

The invention claimed is:

1. A semiconductor optical element comprising:
a wavelength tunable laser on a silicon substrate, wherein the wavelength tunable laser includes:
  a light emitting portion made of a III-V compound semiconductor; and
  an external resonator comprising an optical filter and an optical waveguide, wherein the optical waveguide comprises:
    a lower cladding layer on the silicon substrate, wherein the lower cladding layer comprises an oxide;
    a core on the lower cladding layer, wherein the core comprises SiN, SiON, or $SiO_n$, and wherein n is smaller than 2; and
    an upper cladding layer covering the core, wherein the upper cladding layer comprises an oxide, and wherein the light emitting portion and the external resonator are optically connected via a spot-size converter, wherein the spot-size converter is made of a different material than the core; and
  a semiconductor core made of a III-V compound semiconductor, wherein the semiconductor core is optically connected to the light emitting portion through butt coupling, wherein the semiconductor core is tapered away from the light emitting portion, wherein a tapered region of the semiconductor core is covered by the core, and wherein the spot-size converter is the tapered region of the semiconductor core.

2. The semiconductor optical element according to claim 1, wherein the light emitting portion includes an active layer and current injection portions, wherein the active layer is sandwiched between the current injection portions, and wherein the active layer is disposed on the lower cladding layer.

3. The semiconductor optical element according to claim 1, wherein a heater for controlling wavelength characteristics of guided light is disposed on a portion of the optical waveguide included in the optical filter.

4. The semiconductor optical element according to claim 1, wherein the optical filter includes a lattice filter, a ring filter, an another-mode interferometer, and a loop mirror.

5. The semiconductor optical element according to claim 4, wherein the lattice filter includes a plurality of delay interference filters that are optically connected in a multi-stage manner, and wherein delay lengths of stages corresponding to the plurality of delay interference filters are different from each other.

6. The semiconductor optical element according to claim 4, further comprising a semiconductor core on a port of the lattice filter, the ring filter, the another-mode interferometer, or an metallic anti-reflection structure.

7. The semiconductor optical element according to claim 4, further comprising a structure for power consumption reduction including a semiconductor core portion, wherein the semiconductor core portion is disposed in the optical filter.

8. A method for forming a semiconductor optical element, the method comprising:
forming a wavelength tunable laser on a silicon substrate, wherein forming the wavelength tunable laser includes:
  providing a light emitting portion made of a III-V compound semiconductor; and
  connecting the light emitting portion to an external resonator via a spot-size converter, wherein an external resonator comprises an optical filter and an optical waveguide, and wherein the optical waveguide comprises:
    a lower cladding layer on the silicon substrate, wherein the lower cladding layer comprises an oxide;
    a core on the lower cladding layer, wherein the core comprises SiN, SiON, or SiOn, and wherein n is smaller than 2, wherein the spot-size converter is made of a different material than the core; and
    an upper cladding layer covering the core, wherein the upper cladding layer comprises an oxide; and
optically connected a semiconductor core to the light emitting portion through butt coupling, wherein the semiconductor core that is made of a III-V compound semiconductor, wherein the semiconductor core is tapered away from the light emitting portion, wherein a tapered region of the semiconductor core is covered by the core, and wherein the spot-size converter is the tapered region of the semiconductor core.

9. The method according to claim 8, wherein the light emitting portion includes an active layer and current injection portions, wherein the active layer is sandwiched between the current injection portions, and wherein the active layer is disposed on the lower cladding layer.

10. The method according to claim 8, wherein a heater for controlling wavelength characteristics of guided light is disposed on a portion of the optical waveguide included in the optical filter.

11. The method according to claim 8, wherein the optical filter includes a lattice filter, a ring filter, an another-mode interferometer, and a loop mirror.

12. The method according to claim 11, wherein the lattice filter includes a plurality of delay interference filters that are optically connected in a multi-stage manner, and wherein delay lengths of stages corresponding to the plurality of delay interference filters are different from each other.

13. The method according to claim 11, further comprising disposing a semiconductor core on a port of the lattice filter, the ring filter, the another-mode interferometer, or an metallic anti-reflection structure.

14. The method according to claim 11, further comprising disposing a semiconductor core portion of a structure for power consumption reduction including in the optical filter.

\* \* \* \* \*